United States Patent
Nguyen et al.

(10) Patent No.: US 6,400,598 B1
(45) Date of Patent: Jun. 4, 2002

(54) PROGRAMMABLE LOGIC INTEGRATED CIRCUIT DEVICES WITH LOW VOLTAGE DIFFERENTIAL SIGNALING CAPABILITIES

(75) Inventors: Khai Nguyen, San Jose; Xiaobao Wang, Santa Clara; In Whan Kim, San Jose; Chiakang Sung; Richard G. Cliff, both of Milpitas; Joseph Huang, San Jose; Bonnie I. Wang, Cupertino; Wayne Yeung, San Francisco, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/843,299

(22) Filed: Apr. 25, 2001

Related U.S. Application Data

(63) Continuation of application No. 09/340,222, filed on Jun. 25, 1999, now Pat. No. 6,236,231.
(60) Provisional application No. 60/115,213, filed on Jan. 8, 1999, provisional application No. 60/115,214, filed on Jan. 8, 1999, and provisional application No. 60/091,524, filed on Jul. 2, 1998.

(51) Int. Cl.[7] ................................................. G11C 5/06
(52) U.S. Cl. .......................................... 365/63; 326/39
(58) Field of Search ........................ 326/38, 39; 365/63

(56) References Cited

U.S. PATENT DOCUMENTS

| | | | |
|---|---|---|---|
| 3,473,160 A | 10/1969 | Wahlstrom | 340/172.5 |
| 5,067,007 A | 11/1991 | Kanji et al. | 357/74 |
| 5,689,195 A | 11/1997 | Cliff et al. | 326/41 |
| 5,939,904 A | 8/1999 | Fetterman et al. | 327/67 |
| 6,215,326 B1 | 4/2001 | Jefferson et al. | 326/41 |
| 6,252,419 B1 * | 6/2001 | Sung et al. | 326/38 |

OTHER PUBLICATIONS

"LVDS Owner's Manual; Design Guide", National Semiconductor Corporation, Spring 1997, Chapter 1, pp. 1–7.
"Block Diagram for NSM LVDS Output Buffer", "Circuit Trace from National Semiconductor Device", National Semiconductor Corporation.

ORCA Series 3 Field–Programmable Gate Arrays, Preliminary Data Sheet, Rev. 01, Lucent Technologies Inc., Microelectronics Group, Allentown, PA, Aug. 1998, pp. 1–80.

Optimized Reconfigurable Cell Array (ORCA), OR3Cxxx/OR3Txxx Series Field–Programmable Gate Arrays, Preliminary Product Brief, Lucent Technolgies Inc., Microelectronics Group, Allentown, PA, Nov. 1997, pp. 1–7 and unnumbered back cover.

"Using Phase Locked Loop (PLLs) in DL6035 Devices, Application Note", Dyna Chip Corporation, Sunnyvale, CA, 1998, pp. i and 1–6.

"Using the Virtex Delay–Locked Loop, Application Note, XAPP132, Oct. 21, 1998 (Version 1.31)", Xilinx Corporation, Oct. 21, 1998, pp. 1–14.

"Virtex 2.5V Field Programmable Gate Arrays, Advanced Product Specification, Oct. 20, 1998 (Version 1.0)", Xilinx Corporation, Oct. 20, 1998, pp. 1–24.

DY6000 Family, FAST Field Programmable Gate Array, DY6000 Family Datasheet, Dyna Chip Corporation, Sunnyvale, CA, Dec. 1998, pp. 1–66.

* cited by examiner

Primary Examiner—M. Tran
(74) Attorney, Agent, or Firm—Fish & Neave; Robert R. Jackson; Andrew VanCourt

(57) ABSTRACT

A programmable logic device is equipped for low voltage differential signaling ("LVDS") by providing an LVDS input buffer and/or an LVDS output buffer on the device. I/O pins on the device that are used together in pairs for LVDS can alternatively be used individually for other types of signaling. The LVDS buffers are constructed to give good performance and to meet LVDS specifications despite variations due to temperature, manufacturing process inconsistency, and power supply changes.

19 Claims, 9 Drawing Sheets

| ELEMENT | CONDITION |
|---|---|
| 110 | ON |
| 112 | PARTIALLY ON |
| DRAIN OF 110 | PULLED LOW |
| DRAIN OF 112 | ALLOWED TO GO HIGH |
| 120 | ON |
| 122 | PARTIALLY ON |
| 130 | ON |
| 132 | PARTIALLY ON |
| 140 | ON |
| 142 | PARTIALLY ON |
| DRAIN OF 130 | HIGH |
| DRAIN OF 132 | LOW |
| 210 | ON |
| 212 | PARTIALLY ON |
| DRAIN OF 210 | HIGH |
| DRAIN OF 212 | ALLOWED TO GO LOW |
| 220 | ON |
| 222 | PARTIALLY ON |
| 240 | ON |
| 242 | PARTIALLY ON |
| 310 | PARTIALLY ON |
| 312 | ON |
| DRAIN OF 310 | HIGH |
| DRAIN OF 312 | LOW |
| 320 | ON |
| 322 | ON |

*FIG. 3*

PROGRAMMABLE LOGIC INTEGRATED CIRCUIT DEVICES WITH LOW VOLTAGE DIFFERENTIAL SIGNALING CAPABILITIES

This is a continuation of application Ser. No. 09/340,222, filed Jun. 25, 1999, now U.S. Pat. No. 6,236,231 which claims the benefit of the following provisional applications: No. 60/091,524, filed Jul. 2, 1998; No. 60/115,213, filed Jan. 8, 1999; and No. 60/115,214, filed Jan. 8, 1999. All of these prior applications are hereby incorporated by reference herein in their entireties.

BACKGROUND OF THE INVENTION

A standard that has recently been developed for signaling over short distances is known as low voltage differential signaling ("LVDS"). A description of LVDS can be found, for example, in "LVDS Owner's Manual; Design Guide", National Semiconductor, Spring 1997. (The reference mentioned in the preceding sentence is hereby incorporated by reference herein in its entirety.) Although LVDS is limited to distances of a few meters, this constraint is not a problem for use of this type of signaling between devices (e.g., integrated circuits) on a printed circuit board or in other relatively compact systems.

Because programmable logic devices ("PLDs") such as are shown in Cliff et al. U.S. Pat. No. 5,689,195 and Jefferson et al. U.S. Pat. No. 6,215,326 are often desired as components of systems of the type for which LVDS is suitable, it would be desirable to provide PLDs with LVDS capabilities. (The references mentioned in the preceding sentence are hereby incorporated by reference herein in their entireties.) In addition, improvements are constantly being sought for LVDS circuitry generally, in terms, for example, of more uniform speed performance throughout the permitted operating voltage range, improved rejection of spurious signals, protection against open or short-circuited inputs, etc.

In view of the foregoing it is an object of this invention to provide improved circuitry for LVDS generally.

It is another object of this invention to provide PLDs with LVDS capabilities.

SUMMARY OF THE INVENTION

These and other objects of the invention are accomplished in accordance with the principles of one aspect of the invention by providing PLDs with input/output ("I/O") pins that are connected in parallel to several different kinds of input and/or output buffers, including LVDS input and/or output buffers. The PLD is programmable to allow any of the input and/or output buffers to which an I/O pin is connected to be used. This allows the PLD to provide LVDS capabilities, if that is what is desired, without having to dedicate I/O pins to that particular type of use. Because an LVDS connection requires a pair of I/O pins, while many other signaling protocols require only one I/O pin per connection, the PLD circuitry is programmable to allow I/O pins to be used in pairs for LVDS or individually for other types of signaling.

To help make the speed of LVDS circuitry more uniform across the operating voltage range permitted by the LVDS standard, circuitry is provided for strengthening at least one of complementary current sources or sinks used in LVDS input buffers when the operating voltage is such that the circuitry associated with the other current source or sink is no longer able to help the input buffer operate. The thus strengthened current source or sink helps to maintain the speed of the input buffer even though the circuitry associated with the other current source or sink is no longer operating effectively. Hysteresis circuitry may be provided in LVDS input buffers to help the buffer reject spurious input signal fluctuations. Pull-up connections may be provided on LVDS input signal leads to help protect an LVDS input buffer from producing erroneous output signals in response to open or short-circuit conditions on those input signal leads.

An LVDS output buffer in accordance with the invention is constructed to help keep the output voltages within the LVDS standard or specification despite variations due to such factors as (1) manufacturing process inconsistencies, (2) temperature changes, and (3) power supply voltage fluctuations. The LVDS output buffer includes differential output switching circuitry connected in series via resistors between power and ground potentials. One of the resistor circuits preferably includes a current source which tends to increase in resistance as the power supply potential increases, thereby helping to counteract the effect of increasing power supply voltage. The transistors in the differential output switching circuitry and the resistors in series with that circuitry are made so that they all have similar changes in resistance due to manufacturing process variations and temperature changes. This helps keep the LVDS output voltages within LVDS specifications despite these types of variations or changes. Capacitors are also preferably included in the LVDS output buffer to improve the performance of the circuitry in relation to switching transients.

Further features of the invention, its nature and various advantages will be more apparent from the accompanying drawings and the following detailed description of the preferred embodiments.

BRIEF DESCRIPTION OF THE DRAWINGS

FIG. 3 is a chart showing a representative operating condition of the FIG. 2 circuitry.

DETAILED DESCRIPTION OF THE PREFERRED EMBODIMENTS

Figure 1:
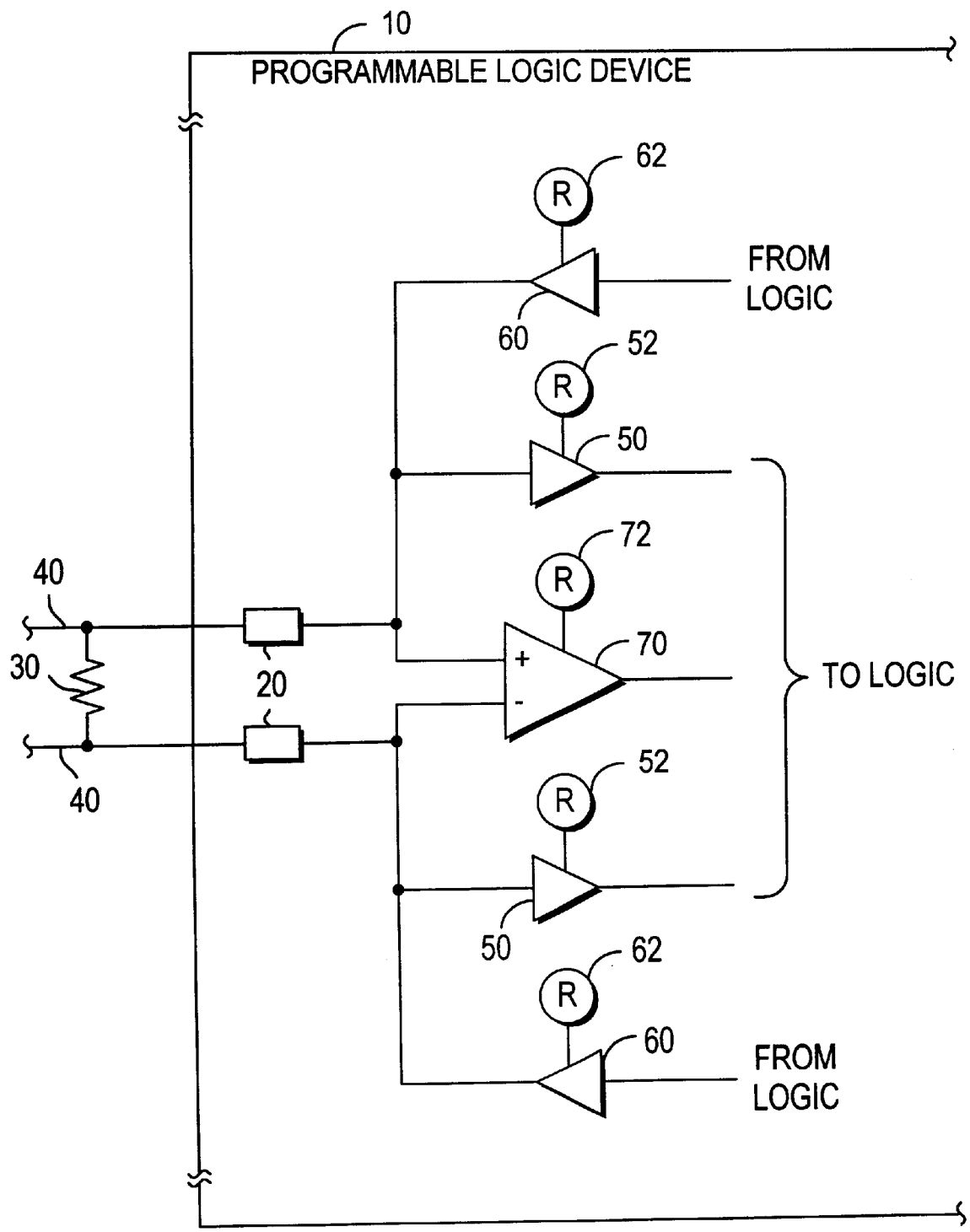
FIG. 1 is a simplified schematic block diagram of a representative portion of an illustrative embodiment of the invention.

FIG. 1 shows a small portion of a programmable logic device 10 constructed in accordance with this invention to include certain LVDS capabilities. FIG. 1 shows the circuitry required to enable device 10 to receive LVDS signals. Circuitry for enabling device 10 to output LVDS signals will be shown in later FIGS. and described later in this specification.

As shown in FIG. 1, device 10 has I/O pins 20. Although only two I/O pins 20 are shown in FIG. 1, it will be understood that these are only representative and that device 10 may have many more such pins. Each of depicted I/O pins 20 can be used separately as an input or output pin when LVDS input via the depicted pins is not desired. In that case, external resistor 30 would not be present. Each pin 20 could then receive an input signal from the associated external signal lead 40, and that signal would be applied to the logic of device 10 via the associated conventional tri-state input buffer 50. For example, the non-LVDS, single-conductor signaling being used could be transistor-transistor logic ("TTL") signaling, and input buffers 50 would then be TTL buffers. Any other single-conductor (non-LVDS) signaling can be used with appropriate input buffers 50. More than one type of input buffer 50 may be connected to each I/O pin 20 so that any of several single-conductor signaling protocols can be used. Each input buffer 50 is programmably controlled by an associated programmable function control element ("FCE") 52 to be either on (i.e., able to drive an applied signal into the logic of device 10) or tri-stated (i.e., off).

Each I/O pin 20 can be alternatively used as an output pin. In that event the associated tri-state output buffer 60 is enabled by its associated FCE 62 to apply a signal from the logic of device 10 to the associated I/O pin 20, which applies that signal to the associated external conductor 40. Again each output buffer 60 may be, for example, a TTL buffer or any other type of single-conductor signaling buffer, and several different types of such buffers may be associated with each pin 20 so that any of several different output signaling protocols can be used.

If it is desired to use depicted pins 20 together for input of LVDS signals, then all of FCEs 52 and 62 are programmed to disable the associated buffers 50 and 60, and FCE 72 is programmed to enable LVDS input buffer 70. Resistor 30 is also included across external leads 40 in accordance with LVDS standards. LVDS input buffer 70 is thereby enabled to convert LVDS input signals on leads 40 to single-conductor signals and to apply those signals to the logic of device 10.

From the foregoing it will be seen that depicted I/O pins 20 can either be used individually for separate inputs or outputs (i.e., by using FCEs 52 or 62 to enable input or output buffers 50 or 60, while using FCE 72 to disable buffer 70), or the depicted pins 20 can be used together as a pair for LVDS input (i.e., by using FCEs 52 and 62 to disable all of buffers 50 and 60, while using FCE 72 to enable buffer 70).

Incidentally, it will be recognized that another term frequently used in the art for elements like buffers 50, 60, and 70 (and 600 in later FIGS.) is "drivers", and the term "driver" may therefore sometimes be used herein as an alternative to "buffer."

Figure 2:
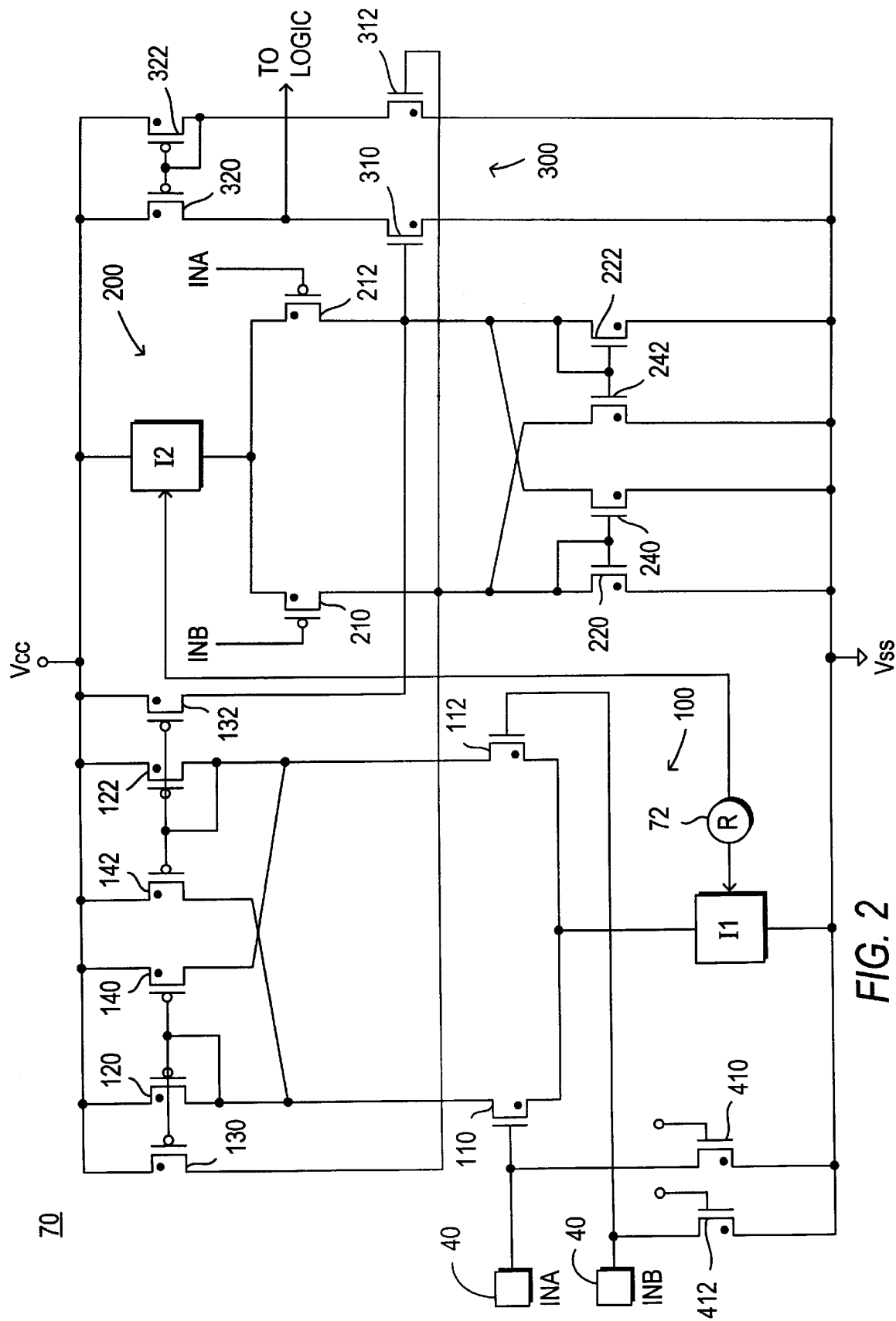
FIG. 2 is a more detailed schematic diagram of an illustrative embodiment of circuitry that can be used for a portion of what is shown in FIG. 1 in accordance with the invention.

An illustrative embodiment of LVDS input buffer 70 is shown in more detail in FIG. 2. Buffer 70 is turned on by programing FCE 72 to turn on current sink I1 and current source I2. When buffer 70 is not to be used, FCE 72 is programmed to turn off elements I1 and I2, thereby conserving power that would otherwise be consumed. Buffer 70 is constructed to be able to detect LVDS signals over the full range of permissible voltages according to LVDS standards. In particular, the offset voltage ("Voffset") of the two LVDS input signals INA and INB in FIG. 2 can be anywhere in the range from 0 volts to 2.4 volts when Vcc (power or logic 1 potential) for device 10 is 2.5 volts. Voffset is the average of the voltages of INA and INB. In order to operate satisfactorily over such a wide Voffset range, and especially at Voffset values that can be so close to Vss (ground or logic 0 potential) or Vcc, buffer 70 includes both an NMOS differential stage 100 and a PMOS differential stage 200. The NMOS differential stage includes NMOS transistors 110 and 112 and operates except when Voffset is close to or below Vtn for NMOS transistors (i.e., the gate voltage required to turn on an NMOS transistor). Thus the NMOS stage stops operating or is partially turned off when Voffset is very close to ground potential. The PMOS differential stage includes PMOS transistors 210 and 212 and operates except when Voffset is above Vcc−Vtp (i.e., the voltage below which the gate of a PMOS transistor must be in order for that transistor to turn on). Thus the PMOS stage stops operating or is partially turned off when Voffset is close to Vcc.

Considering NMOS stage 100 in more detail, one LVDS input (INA) is applied to the gate of transistor 110, and the other LVDS input (INB) is applied to the gate of transistor 112. Current sink I1 pulls current from the sources of both transistors 110 and 112. (Although in the particular circuit relationship that it has in FIG. 2, element I1 is perhaps most accurately described as a current sink, the more generic term for such an element is current source, and that term may sometimes be used herein as an alternative for current sink.) PMOS transistor 120 supplies current to the drain of transistor 110. PMOS transistor 122 supplies current to the drain of transistor 112. PMOS transistor 130 is a current mirror for transistor 120. PMOS transistor 132 is a current mirror for transistor 122. PMOS transistors 140 and 142 are relatively small transistors that increase the resistance of NMOS stage 100 to erroneous toggling in response to possible noise on LVDS signals INA and INB. In other words, transistors 140 and 142 help provide hysteresis in the response of NMOS stage 100 to the LVDS input.

PMOS stage 200 has elements that are functionally analogous to several of those described above for the NMOS stage. Current source I2 supplies current to the sources of transistors 210 and 212. INB is applied to the gate of transistor 210 and INA is applied to the gate of transistor 212. NMOS transistor 220 conveys current from the drain of transistor 210. NMOS transistor 222 conveys current from the drain of transistor 212. NMOS transistors 240 and 242 provide hysteresis.

The combined differential outputs of NMOS stage 100 and PMOS stage 200 are applied to the gates of NMOS transistors 310 and 312 in the output stage 300 of buffer 70. Output stage 300 converts the differential output signals to a single TTL output signal suitable for application to the logic of device 10. Output stage PMOS transistor 320 supplies current to the drain of transistor 310. Output stage PMOS transistor 322 supplies current to the drain of transistor 312. The TTL output signal of buffer 70 comes from the drain of transistor 310.

To illustrate the operation of the FIG. 2 circuitry, FIG. 3 shows the condition of various elements in FIG. 2 when Voffset is in a middle range (i.e., not as low as Vtn or as high as Vcc−Vtp) and when INA is 100 millivolts higher than INB for LVDS transmission of a signal having a first polarity or logic value. (When INB is 100 millivolts higher than INA for LVDS transmission of a signal having a second polarity or logic value, all of the conditions shown in FIG. 3 are reversed. For example, transistors shown as "partially on" in FIG. 3 become "on", and the associated transistors shown as "on" in FIG. 3 become "partially on". "On" transistors 320 and 322 in FIG. 3 also become "partially on.") As is at least implied by the earlier discussion, when Voffset becomes approximately Vcc–Vtp or higher, PMOS differential stage 200 ceases to operate, but NMOS stage 100 continues to perform well and provides the proper logic output on the right in FIG. 2. Thus the LVDS input buffer circuitry shown in FIG. 2 operates well over the entire Voffset required by the LVDS standard.

FIG. 2 also shows optional NMOS transistors 410 and 412 for respectively providing a weak pull down of leads INA and INB to ground. This is desirable for helping to prevent buffer 70 from producing spurious output signals in the event that leads INA and INB are open or shorted external to device 10.

Figure 4:
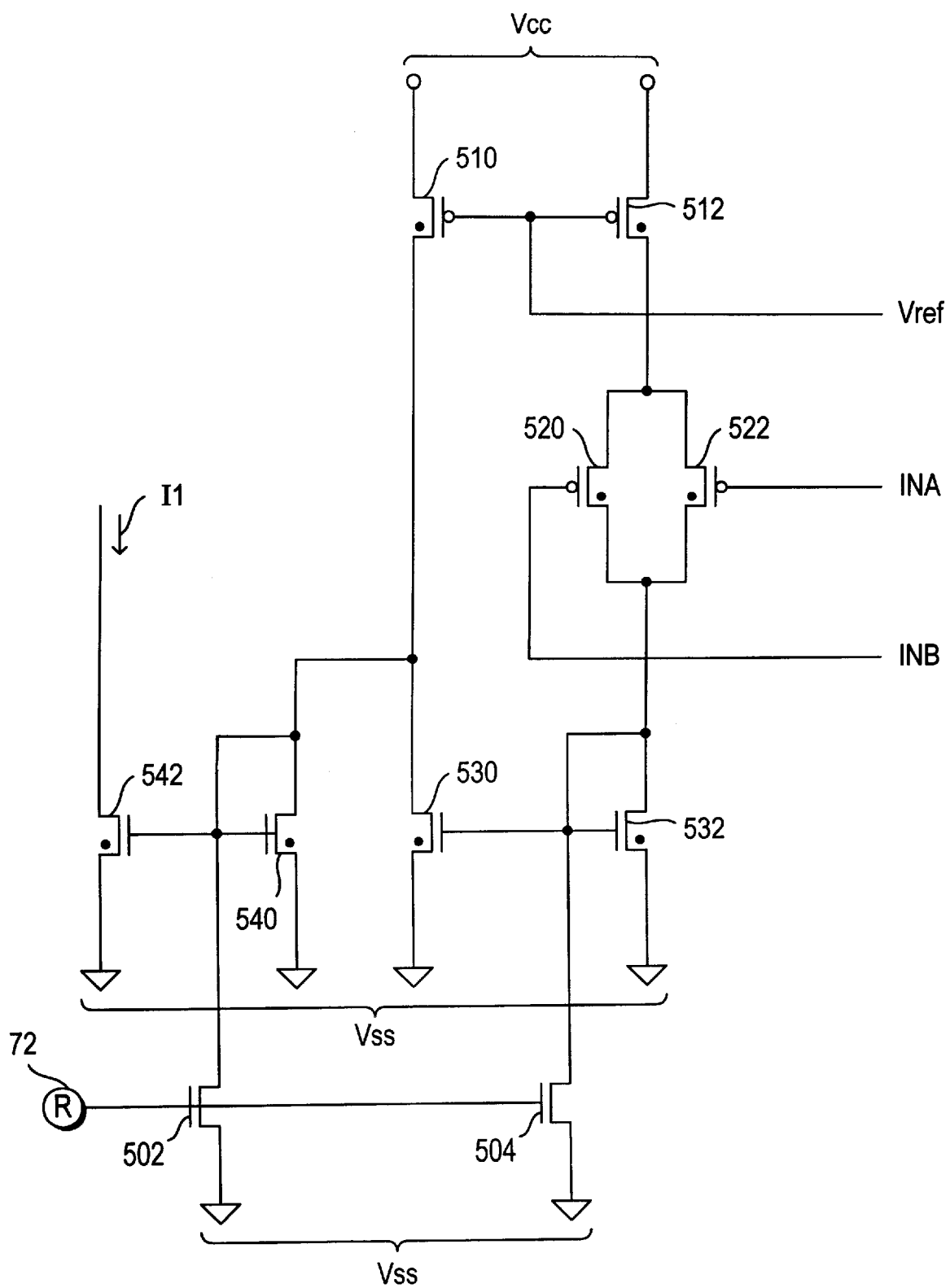
FIG. 4 is a more detailed schematic diagram of an illustrative embodiment of circuitry that can be used for a portion of what is shown in FIG. 2 in accordance with the invention.
Figure 5:
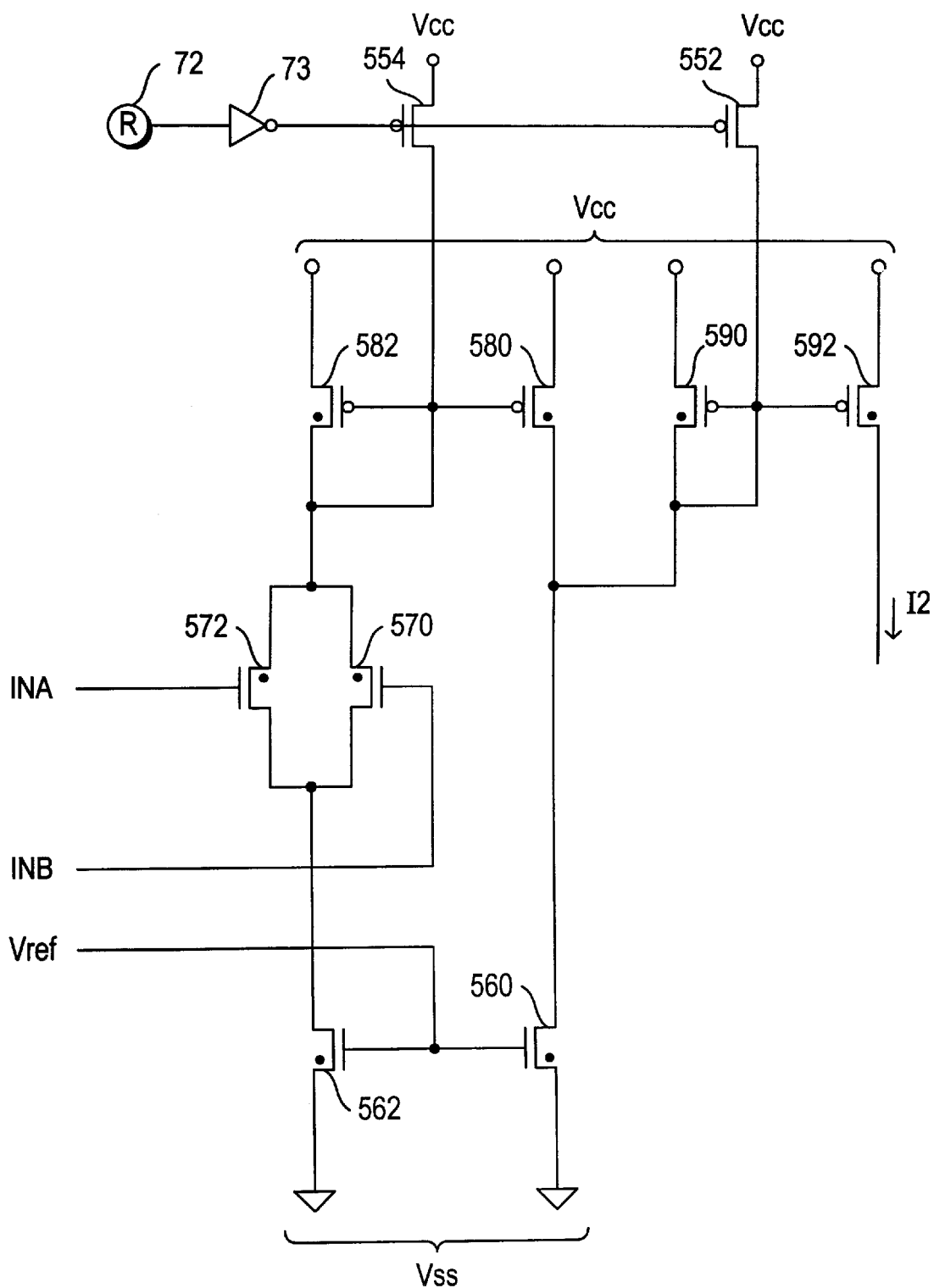
FIG. 5 is similar to FIG. 4 for another portion of what is shown in FIG. 2.

An especially preferred embodiment of current sink I1 in FIG. 2 is shown in FIG. 4, and a similarly preferred embodiment of current source I2 in FIG. 2 is shown in FIG. 5. The current sink of FIG. 4 has the advantage that as Voffset approaches and possibly exceeds Vcc-Vtp, the current drawn by the current sink increases. This increases the strength of NMOS differential stage 100 in FIG. 2 as the strength of PMOS stage 200 is decreasing (or even becoming a load). In this way the speed performance of LVDS buffer 70 is kept relatively constant even when PMOS stage 200 ceases to contribute.

Considering FIG. 4 now in more detail, the current sink circuitry of this FIG. is turned on by programming FCE 72 to turn off NMOS transistors 502 and 504. Conversely, programming FCE 72 to turn on transistors 502 and 504 turns off the depicted current sink by clamping the gates of all of NMOS transistors 530, 532, 540, and 542 to ground, thereby turning off all of those transistors. The following further discussion of the FIG. 4 circuitry assumes that the current sink is turned on by turning off transistors 502 and 504.

I1 is the current drawn by element I1 in FIG. 2. Vref is a reference potential having a value which is approximately one-half of Vcc. Thus PMOS transistors 510 and 512 are on at all times. If INA and INB are higher than Vcc–Vtp, both of PMOS transistors 520 and 522 are off. This means that both of NMOS transistors 530 and 532 are off. (Transistors 530 and 532 are connected in a current mirroring configuration.) Because transistor 530 is off, all current from transistor 510 must flow through NMOS transistor 540, which is on. NMOS transistor 542 is connected in a current mirroring configuration with transistor 540. Because transistor 540 is strongly on, transistor 542 will be strongly on and current I1 will be relatively large.

Values of INA and INB below Vcc-Vtp cause transistors 520 and 522 to turn on. This turns on transistors 530 and 532. Transistor 530 "steals" some current from transistor 540, thereby causing transistor 542 to reduce the amount of current I1.

From the foregoing it will be seen that when INA and INB are high enough to reduce or eliminate the contribution of PMOS differential stage 200 in FIG. 2, current I1 is increased to increase the effectiveness of NMOS differential stage 100. In this way, NMOS stage 100 can compensate for the loss of the PMOS stage 200 contribution and maintain the operating speed of LVDS buffer 70. When INA and INB are not so high as to prevent PMOS stage 200 from contributing, current I1 does not need to be so large and is accordingly reduced.

The embodiment of current source I2 shown in FIG. 5 is conceptually similar to what is shown in FIG. 4. The FIG. 5 circuit increases current I2 when INA and INB are low (close to Vtn). This enables PMOS stage 200 in FIG. 2 to operate more strongly when NMOS stage 100 is weak or unable to operate. The construction and operation of the FIG. 5 circuit are so similar to the FIG. 4 circuit that it is not believed necessary to describe FIG. 5 in full detail. Analogous elements in FIGS. 4 and 5 have reference numbers that differ by 50. Thus element 510 in FIG. 4 is analogous to element 560 in FIG. 5. Inverter 73 inverts the output signal of FCE 72 for application to the gates of PMOS transistors 552 and 554 so that the FIG. 5 current source is turned on or off by the same state of FCE 72 that turns the current sink of FIG. 4 on or off, respectively.

Figure 6:
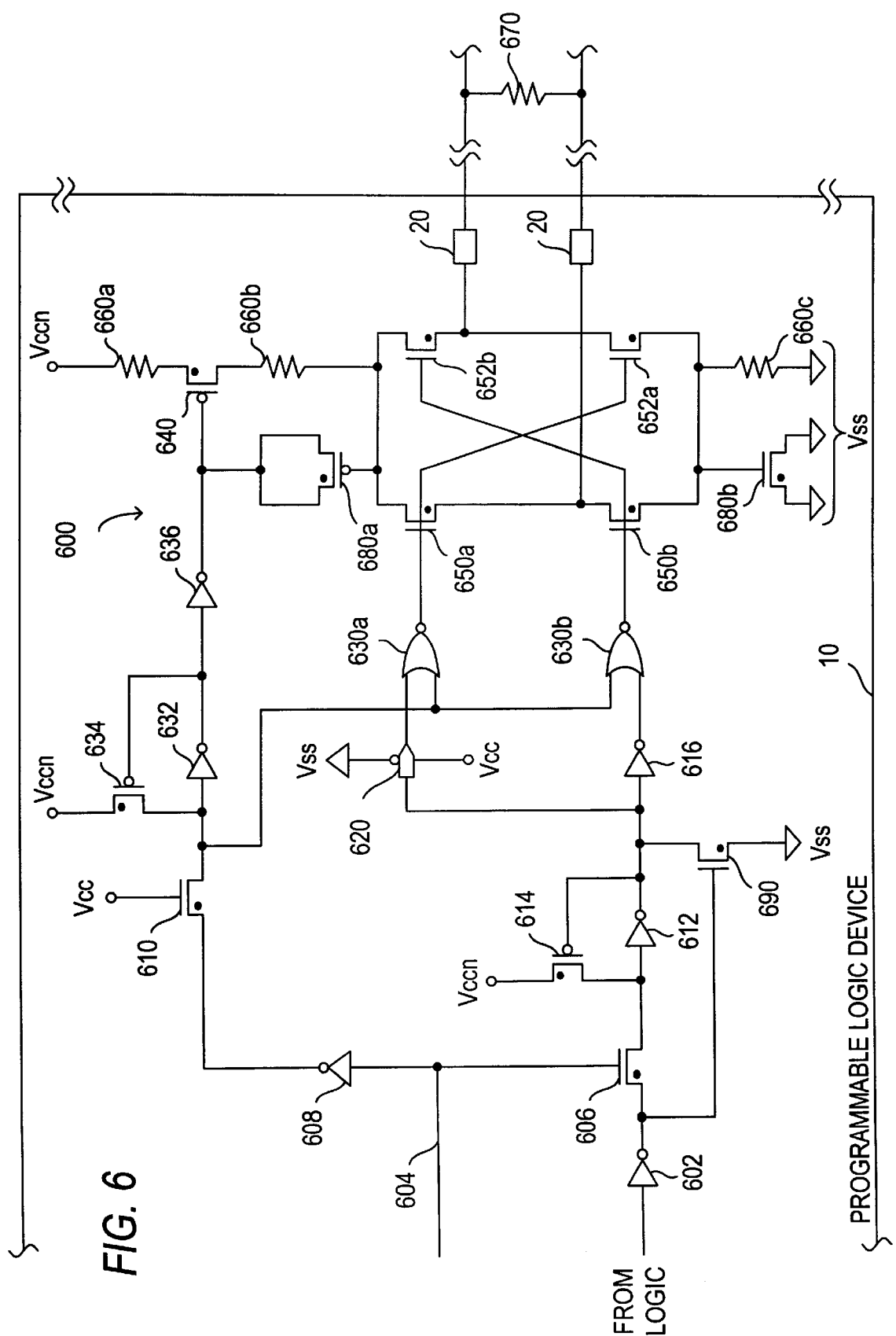
FIG. 6 is a simplified schematic diagram of another representative portion of an illustrative embodiment of the invention.

Preferred LVDS output buffer circuitry 600 in accordance with the invention is shown in FIG. 6. A data signal (e.g., from logic circuitry (not shown, but typically conventional) on device 10) is applied to output buffer circuitry 600 via inverter 602. An LVDS output buffer enable signal (e.g., from a programmable FCE or from logic circuitry on device 10) is applied to circuitry 600 via lead 604. If the signal on lead 604 is a buffer-enabling signal (logic 1 in the depicted embodiment), NMOS transistor 606 is enabled to pass the data signal from inverter 602. The signal on lead 604 is inverted by inverter 608 and passed by transistor 610 to be applied to one input terminal of each of NOR gates 630a and 630b. Assuming that the signal on lead 604 is logic 1, NOR gates 630a and 630b will be enabled by the resulting logic 0 inputs to pass (in inverted form) the signals applied to their other input terminals. The output signal of transistor 610 is inverted by two successive inverters 632 and 636 and applied to the gate of PMOS transistor 640. (Transistor 634 is connected in level-restoring relationship to inverter 632.) Again assuming that the signal on lead 604 is logic 1, the resulting logic 0 signal applied to the gate of transistor 640 turns on that transistor.

The data signal passed by transistor 606 (assuming that transistor 606 is turned on by the signal on lead 604) is inverted by successive inverters 612 and 616 and by NOR gate 630b. (Transistor 614 is connected in level-restoring relationship to inverter 612.) The data signal output by inverter 612 is also passed by transmission gate 620 (which has a delay approximately equal to the delay of inverter 616) and inverted by NOR gate 630a.

The output signal of NOR gate 630a is applied to the gates of NMOS transistors 650a and 652a. The output signal of NOR gate 630b is applied to the gates of NMOS transistors 650b and 652b. Accordingly, when the data signal applied to inverter 602 is logic 0, transistors 650a and 652a will be on and transistors 650b and 652b will be off. On the other hand, when the data signal applied to inverter 602 is logic 1, transistors 650a and 652a will be off and transistors 650b and 652b will be on. The upper one of I/O pins 20 in FIG. 6 is connected between the source terminal of transistor 652b and the drain terminal of transistor 652a. The lower one of I/O pins 20 in FIG. 6 is connected between the source terminal of transistor 650a and the drain terminal of transistor 650b.

From the foregoing it will be seen that a logic 0 data signal applied to inverter 602 connects lower I/O pin 20 to Vccn via resistor 660a, transistor 640, resistor 660b, and transistor 650a. (Vccn is a power supply voltage which may be higher than Vcc. For example, Vccn may be 3.3 volts or 2.5 volts when Vcc is 1.8 volts.) The same logic 0 data signal connects the upper I/O pin 20 to Vss via transistor 652a and resistor 660c. Accordingly, a logic 0 data signal causes current to flow from lower I/O pin 20 through the external LVDS circuit (including resistor 670) to upper I/O pin 20.

A logic 1 data signal applied to inverter 602 connects upper I/O pin 20 to Vccn via resistor 660*a*, transistor 640, resistor 660*b*, and transistor 652*b*, and connects lower I/O pin 20 to Vss via transistor 650*b* and resistor 660*c*. Accordingly, a logic 1 data signal causes current to flow from upper I/O pin 20 through the external LVDS circuit (including resistor 670) to lower I/O pin 20. The network including transistors 650 and 652 therefore constitutes differential output switching circuitry configured to produce a pair of LVDS signals at terminals 20 in response to a single input signal applied to inverter 602.

The circuitry that includes PMOS transistor 680*a* acts like a capacitor to help reduce possible voltage excursions of the node at the lower end of resistor 660*b* during transitions in the data signal applied to inverter 602 when all of transistors 650 and 652 may turn on briefly. The circuitry that includes PMOS transistor 680*b* similarly acts like a capacitor to help reduce possible voltage excursions of the node at the upper end of resistor 660*c* during transitions in the data signal applied to inverter 602.

The LVDS output buffer construction shown in FIG. 6 has several important advantages. In general, a circuit for supplying LVDS current through resistor 670 tends to exhibit current variations due to changes in (1) Vccn, (2) temperature, and (3) the process by which device 10 was manufactured. However, the LVDS specification has relatively narrow ranges for permissible output pin voltage difference Vod (250 to 450 millivolts) and Voffset (1.125 to 1.375 volts). The circuitry shown in FIG. 6 is able to meet these output requirements despite variations of the types mentioned earlier in this paragraph.

The LVDS buffer shown in FIG. 6 is constructed as a ratioed circuit including (1) NMOS output transistors 650 and 652 which perform the actual switching, (2) PMOS transistor 640 as a current source, (3) resistors 660*a*, 660*b*, and 660*c* to adjust the DC voltages at the output, and (4) capacitors 680*a* and 680*b* to aid in AC (alternating current or transient) performance. Output transistors 650 and 652 are sized so that their on-resistance is small compared to bias resistors 660*b* and 660*c*. Resistor 660*a* serves to increase the output resistance of PMOS transistor 640, as well as providing for local series feedback so that when the power supply varies, the change in the current is not as great as it otherwise would be. Resistors 660*a*, 660*b*, and 660*c* are preferably all N-plus type to track any variations due to temperature or manufacturing process in NMOS output transistors 650 and 652. The DC voltages at the output, as well as the standby current, are adjusted by adjusting the values of resistors 660*b* and 660*c*. The ratio between (1) the resistors 660*a* and 660*b* above transistors 650 and 652 and (2) the resistor 660*c* below those transistors determines the Voffset range. The total of these resistances (and resistor 670) determines the range of Vod and thus the range of current through resistor 670 (which gives the differential signaling). Because the DC voltages and currents are set by the ratio of the resistors to the transistors, variations in process, temperature, and power supply voltages are rejected.

Capacitors 680*a* and 680*b* reduce charge-sharing effects when the output switches. The capacitors keep the nodes above and below output switching transistors 650 and 652 from drifting during switching and allow for faster rise and fall times, as well as overall speed improvement in the forward delay of the entire output driver.

A disable function is implemented by using NOR gates 630*a* and 630*b*. When disabled, all the output transistors are off, as well as the PMOS current source (i.e., transistor 640). The disable control signal 604 can either be set by an FCE in device 10, or it can be a logic signal routed out to driver 600 so that the user can have the option of enabling it.

An explanation of NMOS transistor 690 is as follows. All inverters, transistors, and NOR gates in FIG. 6 (except inverters 602 and 608) preferably use thick oxide. The reason for this is that these components may see a voltage level Vccn which is higher than Vcc. As has been mentioned, Vccn may be 3.3 volts or 2.5 volts when Vcc is 1.8 volts. The thick oxide protects the device integrity for reliability reasons (due to high voltage). A disadvantage of using thick oxide is that it slightly slows down the speed. Transistor 690 is added to speed up the logic path using a "look ahead" technique. When the output of inverter 602 switches from low to high, transistor 690 turns on and pulls down the input of inverter 616, instead of waiting for the path that includes elements 606 and 612 to respond. When the output of inverter 602 switches from high to low, the "look ahead" does not exist. Transistor 690 simply turns off. The input of inverter 616 is pulled up only when the signal propagates via elements 606 and 612. But usually the low-to-high transition is the worst case (i.e., the speed-limiting transition), and the "look ahead" feature improves performance for this case.

Figure 7:
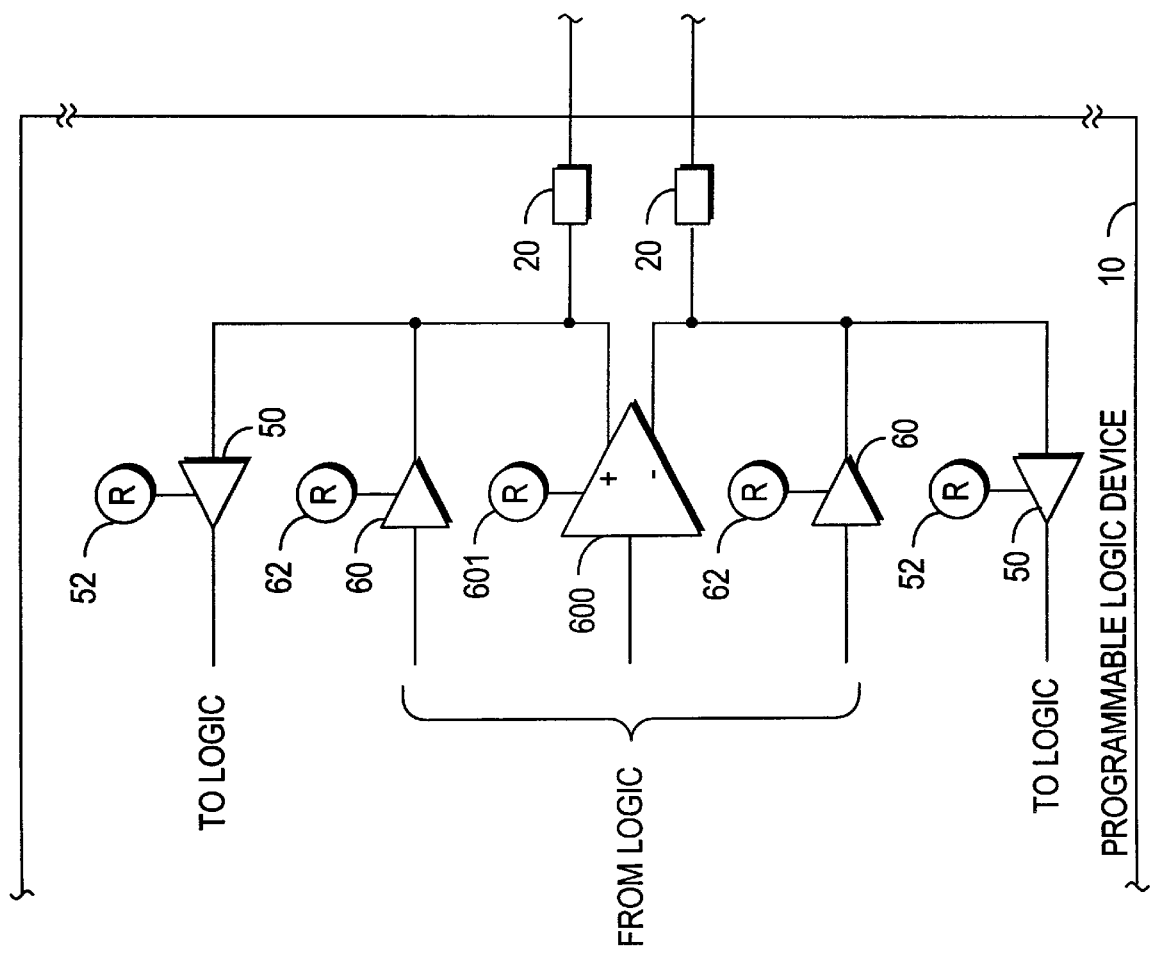
FIG. 7 is a simplified schematic diagram of circuitry of the type shown in FIG. 6 in conjunction with other circuitry, all in accordance with the invention.

FIG. 7 shows circuitry in accordance with the invention for allowing the two I/O pins 20 that are used together with LVDS output buffer 600 to be alternatively used individually with conventional single-conductor input buffers 50 or conventional single-conductor output buffers 60 (similar to similarly numbered elements in earlier FIGS.). Buffer 600 has an associated FCE 601 (the output signal of which can produce the signal on lead 604 in FIG. 6). FCE 601 is programmable by the user of device 10 to control whether or not LVDS output buffer 600 is enabled. Each of buffers 50 and 60 similarly has an associated FCE 52 or 62 programmable by the user to determine whether or not the associated buffer is enabled. If buffer 600 is enabled, then the I/O pins 20 shown in FIG. 7 are used as a pair for LVDS, and all of the other buffers 50 and 60 associated with those pins are disabled. On the other hand, if buffer 600 is disabled, then any one of the other buffers 50/60 associated with each of the I/O pins shown in FIG. 7 can be enabled to allow each pin to be used individually as either a conventional (single-conductor) output pin or a conventional (single-conductor) input pin.

Figure 8:
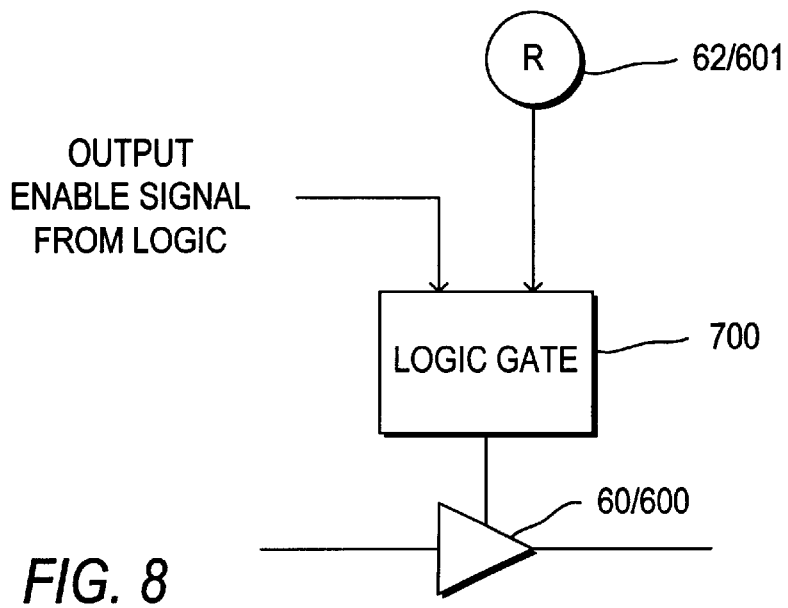
FIG. 8 is a simplified schematic block diagram of possible modification of portions of earlier FIGS. in accordance with the invention.

FIG. 8 shows that the signal which selectively enables any of output buffers 60 or 600 can be a logical combination of the output signal of an FCE 62 or 601 and an output enable signal from the logic of device 10. This logical combination is produced by logic gate 700, which can be chosen to perform any desired logic function (e.g., a NOR function).

Figure 9:
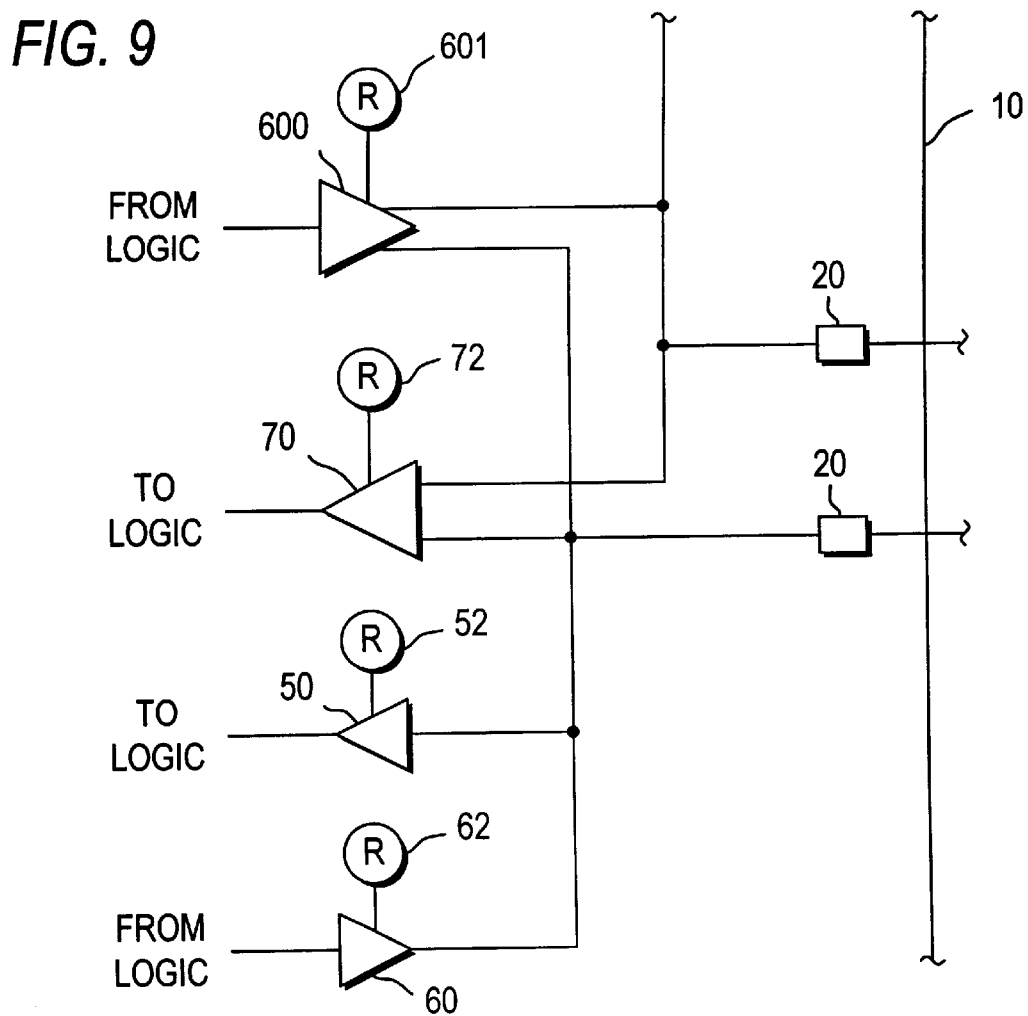
FIG. 9 is a simplified schematic diagram showing possible combination of features from earlier FIGS. in accordance with the invention.

FIG. 9 shows that two I/O pins 20 can be used for either LVDS input (employing LVDS input buffer 70), LVDS output (employing LVDS output buffer 600), or conventional single-conductor input or output (employing buffers 50/60). In effect, FIG. 9 shows that the circuitry shown in FIGS. 1 and 7 can be combined in relation to a given pair of I/O pins 20.

Restating some of the foregoing in more generic terms, a programmable logic device 10 in accordance with the invention includes logic circuitry ("from logic"/"to logic" in FIGS. 1, 2, and 6–9) and a pair of interface terminals 20 for use in making connections to circuitry 30/40/670 that is external to the programmable logic device. The device further includes LVDS buffer circuitry 70/600 connected to both of the interface terminals 20 and configured to exchange with the interface terminals a pair of signals which are respectively associated with the pair of interface terminals and which differ from one another in voltage in order to represent information in accordance with an LVDS standard. The LVDS buffer circuitry may be an input buffer 70 configured to receive the pair of signals from interface terminals 20 and to produce a single output signal ("to logic") indicative of the information for application to the logic circuitry of device 10. Alternatively the LVDS buffer circuitry may be an output buffer 600 configured to receive from the logic circuitry ("from logic") of device 10 a single input signal indicative of the information and to produce the pair of signals indicative of the information for application to interface terminals 20.

Device 10 may also include programmable function control circuitry 72/601 configured to selectively enable the LVDS buffer circuitry 70/600. Device 10 may further include single-conductor signaling buffer circuitry 50/60 connected to one of the interface terminals 20 and configured to exchange with the one of the interface terminals a single signal having voltages which represent data in accordance with a single-conductor signaling standard. Programmable function control circuitry 52/62/72/601 may be provided for selectively enabling either the LVDS buffer circuitry 70/600 or the single-conductor signaling buffer circuitry 50/60 while disabling remaining ones of the LVDS buffer circuitry 70/600 and the single-conductor signaling buffer circuitry 50/60.

Figure 10:
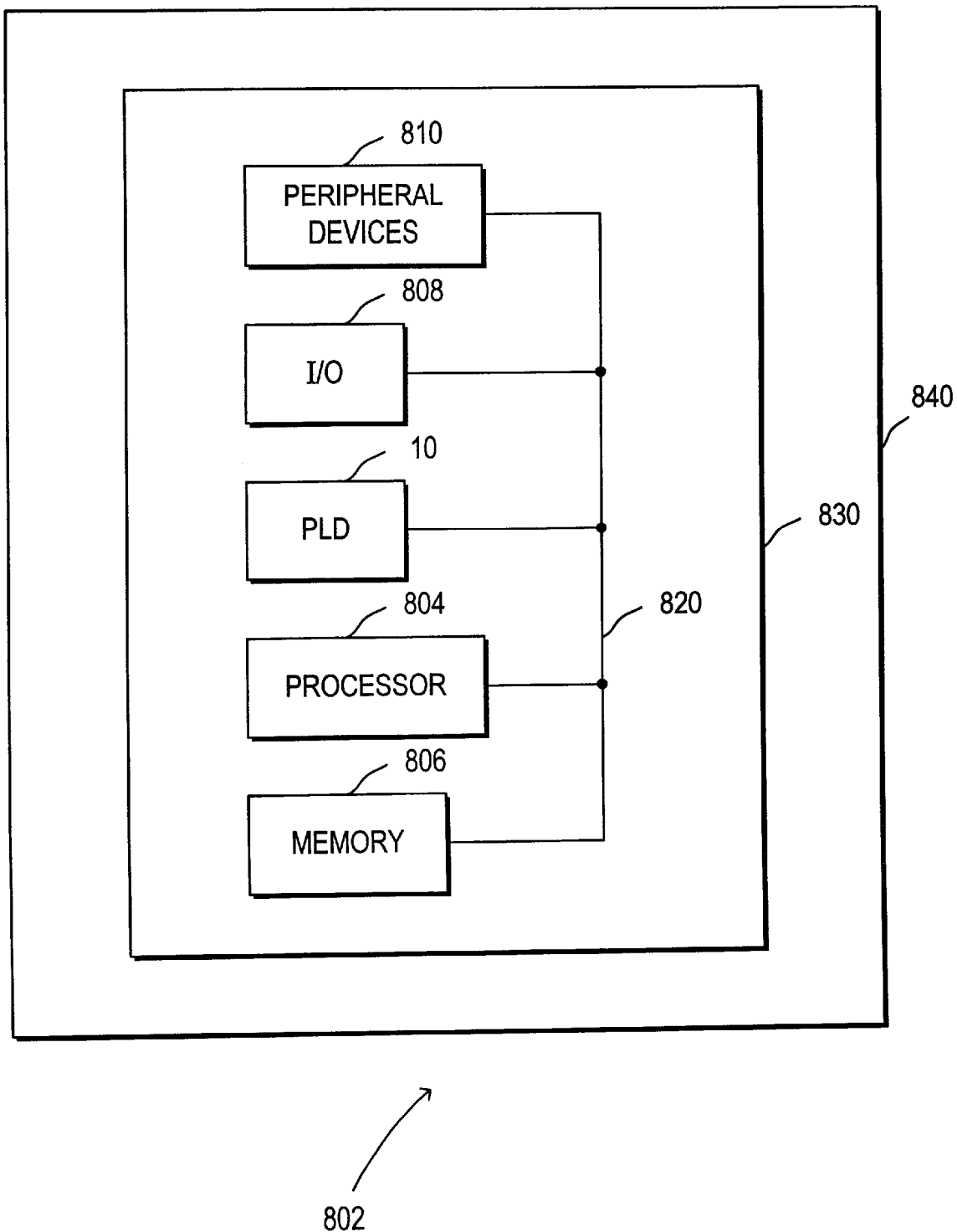
FIG. 10 is a simplified block diagram of an illustrative system employing a programmable logic device including LVDS capabilities in accordance with the invention.

FIG. 10 illustrates a programmable logic device 10 of this invention in a data processing system 802. Data processing system 802 may include one or more of the following components: a processor 804; memory 806; I/O circuitry 808; and peripheral devices 810. These components are coupled together by a system bus 820 and are populated on a circuit board 830 which is contained in an end-user system 840.

System 802 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 804. Programmable logic device 10 may also be used as an arbiter for arbitrating access to a shared resource in system 802. In yet another example, programmable logic device 10 can be configured as an interface between processor 804 and one of the other components in system 802. It should be noted that system 802 is only exemplary, and that the true scope and spirit of the invention should be indicated by the following claims.

Various technologies can be used to implement programmable logic devices 10 providing the LVDS capabilities of this invention. For example, function control elements 52/62/72/601 and other FCEs can be SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the numbers and types of other conventional input and output buffers 50/60 that can make alternative use of the I/O pins 20 associated with LVDS buffers 70/600 in accordance with the invention can be varied as desired.

What is claimed is:

1. A programmable logic device comprising:

programmable logic circuitry;

first and second interface terminals configured for use in making connections between the programmable logic circuitry and circuitry that is external to the programmable logic device;

first buffer circuitry connected to the first and second interface terminals and configured to selectively exchange with the first and second interface terminals respective first and second signals, the relative polarity of which changes over time in order to represent information in accordance with an LVDS standard; and second buffer circuitry connected to the first interface terminal and configured to selectively exchange with the first interface terminal a third signal indicative of alternative information that does not depend on signal conditions at the second interface terminal.

2. The device defined in claim 1 wherein the first and second buffers are both of a same type selected from the group consisting of input type and output type.

3. A programmable logic device comprising:

programmable logic circuitry;

first and second interface terminals configured for use in making connections between the programmable logic circuitry and circuitry that is external to the programmable logic device;

first buffer circuitry connected to the first and second interface terminals and configured to selectively exchange with the first and second interface terminals respective first and second signals, the relative polarity of which changes over time in order to represent information in accordance with an LVDS standard; and second buffer circuitry connected to the first interface terminal and configured to selectively exchange with the first interface terminal a third signal indicative of alternative information that does not depend on signal conditions at the second interface terminal, wherein the first and second buffers are of different types selected from the group consisting of input type and output type.

4. A programmable logic device comprising:

programmable logic circuitry;

first and second interface terminals configured for use in making connections between the programmable logic circuitry and circuitry that is external to the programmable logic device;

first buffer circuitry connected to the first and second interface terminals and configured to selectively exchange with the first and second interface terminals respective first and second signals, the relative polarity of which changes over time in order to represent information in accordance with an LVDS standard;

second buffer circuitry connected to the first interface terminal and configured to selectively exchange with the first interface terminal a third signal indicative of alternative information that does not depend on signal conditions at the second interface terminal; and programmable function control circuitry configured to selectively enable either of the first and second buffer circuitries.

5. A programmable logic device comprising:

programmable logic circuitry;

first and second interface terminals configured for use in making connections between the programmable logic circuitry and circuitry that is external to the programmable logic device;

first buffer circuitry connected to the first and second interface terminals and configured to selectively exchange with the first and second interface terminals respective first and second signals, the relative polarity of which changes over time in order to represent information in accordance with an LVDS standard;

second buffer circuitry connected to the first interface terminal and configured to selectively exchange with the first interface terminal a third signal indicative of alternative information that does not depend on signal conditions at the second interface terminal; and third buffer circuitry connected to the second interface terminal and configured to selectively exchange with the second interface terminal a fourth signal indicative of further alternative information that does not depend on signal conditions at the first interface terminal.

6. A programmable logic device having a pair of pins for use in making connections to circuitry that is external to the programmable logic device, the device comprising:

first buffer circuitry that drives a signal between programmable logic circuitry and a first pin of the pair, wherein the first buffer circuitry is connected to the first pin;

second buffer circuitry that drives at least two signals in accordance with an LVDS standard between the programmable logic circuitry and both pins of the pair, wherein the second buffer circuitry is connected to the first pin and a second pin of the pair; and functional control circuitry connected to the first and second buffer circuitry being programmable to either (1) enable the first buffer circuitry without enabling the second buffer circuitry or (2) enable the second buffer circuitry without enabling the first buffer circuitry.

7. The device of claim 6, wherein the second buffer circuitry drives a programmable logic circuitry signal to the programmable logic circuitry by receiving said at least two signals from the first and second pins.

8. The device of claim 6, wherein the second buffer circuitry drives said at least two signals to the first and second pins by receiving a programmable logic circuitry signal from the programmable logic circuitry.

9. The device of claim 6, wherein the first buffer circuitry drives the signal associated with the first pin independently of any signal associated with the second pin.

10. The device of claim 6, wherein the first buffer circuitry drives the signal in a direction selected from the group consisting of the first pin to the programmable logic circuitry direction and the programmable logic circuitry to the first pin direction.

11. The device of claim 6, further comprising third buffer circuitry connected to the second pin and configured to drive another signal between the second pin and the programmable logic circuitry, wherein the third buffer circuitry drives the other signal associated with the second pin independently of any signals associated with the first pin.

12. The device of claim 11, wherein the third buffer circuitry drives the other signal in a direction selected from the group consisting second pin to the programmable logic circuitry direction and programmable logic circuitry to the second pin direction.

13. The device of claim 11, wherein the third buffer circuitry is connected to the functional control circuitry and is enabled when the first buffer circuitry is enabled.

14. The device of claim 6, wherein said at least two signals differ in relative polarities in voltage to comply with the LVDS standard.

15. A programmable logic device having a pair of pins for use in making connections to circuitry that is external to the programmable logic device, the device comprising:

a dual-conductor buffer connected to both pins of the pair and configured to exchange signals which are respectively associated with that pair and which differ from one another in voltage in order to represent information in accordance with an LVDS standard;

a first single-conductor buffer connected to a first pin of the pair and configured to exchange a signal with the first pin;

functional control circuitry connected to each of the buffers and being programmable to either (1) enable the dual-conductor buffer or (2) enable the first single-conductor buffer.

16. The device of claim 15, wherein the first single-conductor buffer exchanges a third signal that is indicative of alternative information that does not depend on signals associated with a second pin in the pair.

17. The device of claim 15, wherein the dual-conductor buffer and the first single-conductor buffer are of a similar type selected from the group consisting of input type and output type.

18. The device of claim 15, wherein the dual-conductor buffer and the first single-conductor buffer are of different types selected from the group consisting of input type and output type.

19. The device of claim 15 further comprising a second single-conductor buffer connected to the second pin and configured to exchange a fourth signal that is indicative of alternative information that does not depend on signals associated with the first pin.

* * * * *